(12) United States Patent
Yamada et al.

(10) Patent No.: US 8,901,562 B2
(45) Date of Patent: Dec. 2, 2014

(54) RADIATION IMAGING DEVICE, RADIATION IMAGING DISPLAY SYSTEM, AND TRANSISTOR

(75) Inventors: Yasuhiro Yamada, Kanagawa (JP); Tsutomu Tanaka, Kanagawa (JP); Makoto Takatoku, Kanagawa (JP)

(73) Assignee: Sony Corporation, Tokyo (JP)

( * ) Notice: Subject to any disclaimer, the term of this patent is extended or adjusted under 35 U.S.C. 154(b) by 195 days.

(21) Appl. No.: 13/334,945

(22) Filed: Dec. 22, 2011

(65) Prior Publication Data

US 2012/0175618 A1 Jul. 12, 2012

(30) Foreign Application Priority Data

Jan. 12, 2011 (JP) ................................. 2011-003742

(51) Int. Cl.
| | | |
|---|---|---|
| *H01L 29/04* | (2006.01) | |
| *H01L 27/12* | (2006.01) | |
| *H01L 27/146* | (2006.01) | |
| *H01L 29/786* | (2006.01) | |
| *H04N 5/32* | (2006.01) | |

(52) U.S. Cl.
CPC .... *H01L 27/14663* (2013.01); *H01L 29/78645* (2013.01); *H01L 29/78648* (2013.01); *H04N 5/32* (2013.01)
USPC ................. 257/59; 257/66; 257/72; 257/412; 257/414; 257/E21.414; 257/E21.415; 257/E29.275; 257/E29.291; 438/149; 438/283

(58) Field of Classification Search
CPC ................... H01L 29/78645; H01L 29/78648; H01L 27/14663
USPC ................. 257/59, 66, 72, 412, 414, E21.414, 257/E21.415, E29.275, E29.291; 438/149, 438/283
See application file for complete search history.

(56) References Cited

U.S. PATENT DOCUMENTS

| | | | | | |
|---|---|---|---|---|---|
| 5,936,265 | A | * | 8/1999 | Koga | ............................ 257/105 |
| 6,054,734 | A | * | 4/2000 | Aozasa et al. | ................ 257/315 |
| 6,146,927 | A | * | 11/2000 | Yamanaka | ..................... 438/149 |
| 7,512,012 | B2 | * | 3/2009 | Kuo | ......................... 365/185.26 |
| 8,158,980 | B2 | * | 4/2012 | Yamazaki et al. | .............. 257/59 |
| 8,188,477 | B2 | * | 5/2012 | Miyairi et al. | .................. 257/59 |
| 2008/0246090 | A1 | * | 10/2008 | Dokumaci et al. | ............ 257/347 |

FOREIGN PATENT DOCUMENTS

| | | |
|---|---|---|
| JP | 08-008426 | 1/1996 |
| JP | 2004-265935 | 9/2004 |

\* cited by examiner

*Primary Examiner* — Dao H Nguyen
(74) *Attorney, Agent, or Firm* — Dentons US LLP

(57) ABSTRACT

There are provided a transistor and a radiation imaging device in which a shift in a threshold voltage due to radiation exposure may be suppressed. The transistor includes a first gate electrode, a first gate insulator, a semiconductor layer, a second gate insulator, and a second gate electrode in this order on a substrate. Each of the first and second gate insulators includes one or a plurality of silicon compound films having oxygen, and a total sum of thicknesses of the silicon compound films is 65 nm or less.

19 Claims, 16 Drawing Sheets

| | FILM THICKNESS (nm) | | | | | | | |
|---|---|---|---|---|---|---|---|---|
| | EXAMPLE 1 | EXAMPLE 2 | EXAMPLE 3 | EXAMPLE 4 | EXAMPLE 5 | COMPARATIVE EXAMPLE 1 | COMPARATIVE EXAMPLE 2 | COMPARATIVE EXAMPLE 3 |
| SiO₂ SUM TOTAL | 10 | 40 | 55 | 55 | 65 | 70 | 85 | 95 |
| 120B (Mo) | 90 | 90 | 120 | 90 | 120 | 90 | 120 | 120 |
| 130C (SiO₂) | 0 | 0 | 20 | 0 | 20 | 15 | 20 | 20 |
| 130B (SiNx) | 110 | 110 | 80 | 80 | 60 | 50 | 80 | 60 |
| 130A (SiO₂) | 5 | 5 | 30 | 20 | 40 | 20 | 30 | 40 |
| 126a (p-Si) | 43 | 43 | 43 | 43 | 43 | 43 | 43 | 43 |
| 129B (SiO₂) | 5 | 35 | 5 | 35 | 5 | 35 | 35 | 35 |
| 129A (SiNx) | 110 | 50 | 100 | 50 | 100 | 50 | 50 | 50 |
| 120A (Mo) | 65 | 65 | 65 | 65 | 65 | 65 | 65 | 65 |
| ΔVth | 1.07 | 1.20 | 1.41 | 1.41 | 1.34 | 1.49 | 2.74 | 2.88 |
| S VALUE (V/decade) | 0.51 | 0.45 | 0.74 | 0.83 | 0.49 | 0.35 | 0.36 | 0.47 |

FIG. 14

RADIATION IMAGING DEVICE, RADIATION IMAGING DISPLAY SYSTEM, AND TRANSISTOR

BACKGROUND

The present disclosure relates to a radiation imaging device and a radiation imaging display system which are suitable for X-ray radiography for medical care and non-destructive inspection, for example, and also to a transistor which is used in such a radiation imaging device.

In recent years, as a technique of acquiring images as electric signals (imaging techniques employing photoelectric conversion), techniques using a Charge Coupled Device (CCD) image sensor or a Complementary Metal Oxide Semiconductor (CMOS) image sensor have been mainstream. An imaging area in these image sensors is limited to the size of a crystal substrate (silicon wafer). However, in particular, in the medical field and the like in which imaging is performed using X-rays, an increase in the imaging area is desired and also, demand for moving-image performance is rising.

For example, as a chest X-ray machine for a human body, there is used the following radiation imaging device that obtains an image based on radiation as an electric signal without mediation of a radiographic film. That is a so-called radiation imaging device of indirect conversion type, in which a wavelength conversion layer is provided on a circuit board including a photoelectric conversion element such as a photodiode and a thin-film transistor (TFT). By such a configuration, radiation entering the device is converted into visible light in the wavelength conversion layer, and this visible light is received by the photoelectric conversion element. Reading of the photoelectric conversion element is carried out by the circuit including the TFT, and thereby an electric signal is obtained.

Further, in addition to the radiation imaging device of the indirect conversion type using the wavelength conversion layer as described above, there is also a so-called radiation imaging device of direct conversion type provided with a functional layer that directly converts radiation into an electric signal (for example, a direct conversion layer made of a-Se or Cd—Te). In this radiation imaging device of the direct conversion type, the radiation is allowed to enter the direct conversion layer and electric charge corresponding to the incident amount is accumulated in a capacitor provided in the circuit board, and the electric charge is read by the transistor, and thereby an electric signal based on the amount of the entering radiation is obtained. The transistor used in these radiation imaging devices (of the indirect conversion type, and the direct conversion type) has, for example, a gate insulator between a gate electrode and a semiconductor layer forming a channel, and the gate insulator is formed to include a silicon oxide film.

Here, in a case where the silicon oxide film is used (or in a case where a laminated film including silicon oxide is used) as the gate insulator of the transistor, when radiation is taken into such a gate insulator, electrons in the film are excited by a photoelectric effect, Compton scattering, electron pair production, or the like. It is known that, as a result, positive holes are trapped and remain at an interface or a defect, and a threshold voltage (Vth) shifts to the negative side due to the charge of this positive charge (see, for example, Japanese Unexamined Patent Application Publication No. 08-8426).

On the other hand, in the radiation imaging device of the direct conversion type as described above, the transistor is exposed to radiation, and a shift of a threshold voltage by the charge of positive holes like the one described above takes place easily. Further, even in the radiation imaging device of the indirect conversion type, some of the radiation entering the wavelength conversion layer pass through the wavelength conversion layer directly (without being converted into visible light). Therefore, there may be a case where the transistor is not a little exposed to radiation, and a shift in the threshold voltage occurs.

Thus, an attempt to reduce the shift in the threshold voltage is made, by adopting a structure in which a semiconductor layer becoming a channel is interposed between a pair of gate electrodes, the so-called dual-gate structure, thereby eliminating an influence of a back channel effect of positive holes and electrons produced in a photoelectric conversion element (see Japanese Unexamined Patent Application Publication No. 2004-265935).

SUMMARY

However, in the dual-gate structure as described above, when a silicon oxide film is used as the gate insulator, the amount of a shift in the threshold voltage increases depending on the film thickness of the silicon oxide film, making it difficult to maintain reliability.

In view of the foregoing, it is desirable to provide a transistor and a radiation imaging device in which a shift in a threshold voltage due to radiation exposure may be suppressed.

According to an embodiment of the present disclosure, there is provided a transistor including a first gate electrode, a first gate insulator, a semiconductor layer, a second gate insulator, and a second gate electrode in this order on a substrate, and each of the first and second gate insulators includes one or more silicon compound films having oxygen, and a total sum of thicknesses of the silicon compound films is 65 nm or less.

According to another embodiment of the present disclosure, there is provided a radiation imaging device including the transistor of the above-described embodiment, a pixel section acquiring an electric signal based on radiation.

In the transistor and the radiation imaging device according to the above-described embodiments, the first gate electrode, the first gate insulator, the semiconductor layer, the second gate insulator, and the second gate electrode are provided in this order on the substrate, each of the first and second gate insulators includes the one or more silicon compound films having oxygen. In such first and second gate insulators, when the radiation enters, positive holes tend to be charged to shift a threshold voltage to the negative side. The amount of this shift is minute when the total sum of the thicknesses of the silicon compound films containing oxygen is 65 nm or less, but increases rapidly when the total sum of the thicknesses of the silicon compound films exceeds 65 nm under the influence of an S value change or the like. In other words, because the total sum of the thicknesses of the silicon compound films is 65 nm or less, such a shift of threshold voltage is reduced.

According to another embodiment of the present disclosure, there is provided a radiation imaging display system including an imaging device acquiring an image based on radiation (the radiation imaging device according to the above-described embodiment) and a display device displaying the image acquired by this imaging device.

According to the transistor and the radiation imaging device in the above-described embodiments, the first gate electrode, the first gate insulator, the semiconductor layer, the second gate insulator, and the second gate electrode are provided in this order on the substrate, and each of the first and second gate insulators includes the one or more silicon compound films having oxygen. In such a configuration, it is possible to suppress a shift in the threshold voltage, by setting the total sum of the thicknesses of the silicon compound films at 65 nm or less.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIG. 14 a table illustrating film-thickness conditions in examples 1 to 5 and comparative examples 1 to 3.

DETAILED DESCRIPTION OF EMBODIMENT

An embodiment of the present disclosure will be described below in detail with reference to the drawings. Incidentally, the description will be provided in the following order.
1. Embodiment (an example of a radiation imaging device of indirect conversion type, including a transistor in which the total sum of the thicknesses of silicon oxide films in a gate insulator is 65 nm or less)
2. Modification 1 (an example in which a pixel drive circuit is a passive drive circuit)
3. Modification 2 (an example of a radiation imaging device of direct conversion type)
4. Application example (an example of a radiation imaging display system)

[Embodiment]
[Overall Configuration of Radiation Imaging Device]

Figure 1:
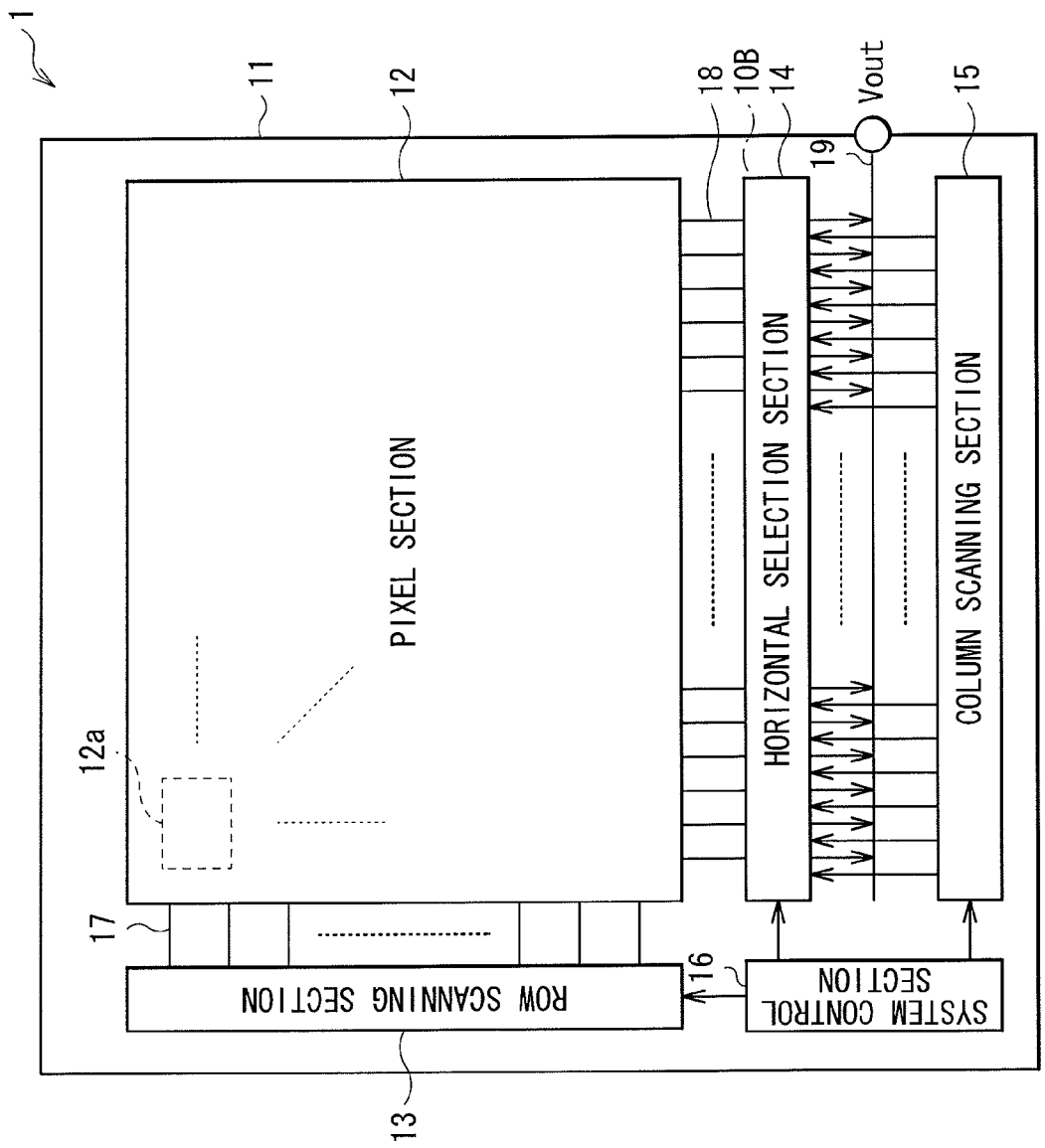
FIG. 1 is a functional block diagram illustrating an overall configuration of a radiation imaging device according to an embodiment of the present disclosure.

FIG. 1 illustrates an overall configuration of a radiation imaging device (a radiation imaging device 1) according to an embodiment of the present disclosure. The radiation imaging device 1 is a so-called indirect conversion type Flat Panel Detector (FPD), and receives radiation represented by α-rays, β-rays, γ-rays, and X-rays after wavelength conversion and reads image information based on the radiation. This radiation imaging device 1 is suitably used as an X-ray imaging device for medical care and other non-destructive inspections such as a baggage inspection.

The radiation imaging device 1 has a pixel section 12 on a substrate 11, and around this pixel section 12, there are provided peripheral circuits (drive circuits) including, for example, a row scanning section 13, a horizontal selection section 14, a column scanning section 15, and a system control section 16.

The pixel section 12 is an imaging area in the radiation imaging device 1. In this pixel section 12, unit pixels 12a (hereinafter may be merely referred to as "pixels"), which include a photoelectric conversion section (a photoelectric conversion layer 112 to be described later) that generates photocharge with the quantity of electric charge corresponding to the amount of incident light and accumulates the photocharge inside thereof, are arranged two-dimensionally. For the unit pixels 12a, for example, two wires (specifically, a row selection line and a reset control line) are provided for every pixel row as a pixel driving line 17.

Further, in the pixel section 12, for an array of the pixels in rows and columns, the pixel driving line 17 is arranged for every pixel row along a row direction (an arrangement direction of the pixels in the pixel row), and a vertical signal line 18 is arranged for every pixel column along a column direction (an arrangement direction of the pixels in the pixel column) The pixel driving line 17 transmits a driving signal for reading a signal from the pixel. In FIG. 1, the pixel driving line 17 is illustrated as a single wire, but is not limited to the single wire. One end of the pixel driving line 17 is connected to an output end corresponding to each row of the row scanning section 13. The configuration of this pixel section 12 will be described later.

The row scanning section 13 is configured by using, for example, a shift register, an address decoder, and the like, and is a pixel driving section that drives each of the pixels 12a in the pixel section 12 row by row, for example. A signal outputted from each unit pixel of each pixel row selected and scanned by the row scanning section 13 is supplied to the horizontal selection section 14 through each of the vertical signal lines 18. The horizontal selection section 14 is configured by using an amplifier, a horizontal selection switch, and the like provided for every vertical signal line 18.

The column scanning section 15 is configured by using a shift register, an address decoder, and the like, and scans and drives each horizontal selection switch of the horizontal selection section 14 sequentially. Through the selection scanning by this column scanning section 15, a signal of each pixel transmitted through each of the vertical signal lines 18 is sequentially outputted to a vertical signal line 19, and is transmitted to the outside of the substrate 11 through the vertical signal line 19.

Circuit parts including the row scanning section 13, the horizontal selection section 14, the column scanning section 15, and the vertical signal line 19 may be circuits directly formed on the substrate 11, or may be disposed in an external control IC. Further, those circuit parts may be formed on other substrate connected by a cable or the like.

The system control section 16 receives a clock provided from the outside of the substrate 11, data instructing an operation mode, and the like, and outputs data such as inside information of the radiation imaging device 1. Further, the system control section 16 has a timing generator generating various kinds of timing signals, and controls driving of peripheral circuits such as the row scanning section 13, the horizontal selection section 14, and the column scanning section 15 based on the various kinds of timing signals generated by the timing generator.

(Detailed Configuration of Pixel Section 12)

Figure 2:
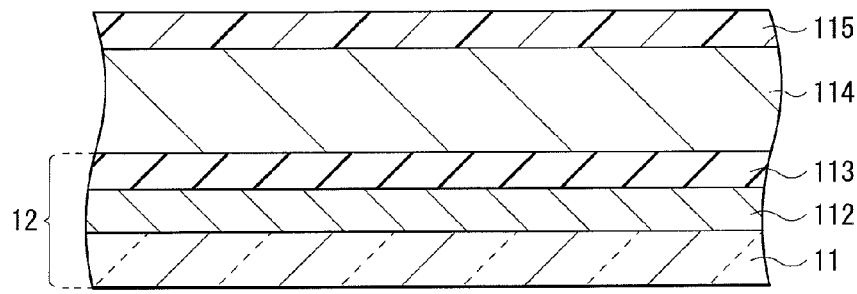
FIG. 2 is a schematic diagram illustrating a cross section structure of a pixel section (an indirect conversion type) illustrated in FIG. 1.

FIG. 2 illustrates a cross section structure of the pixel section 12. The pixel section 12 has, on the substrate 11, the photoelectric conversion layer 112 including a photodiode 111A and a transistor 111B to be described later. On this photoelectric conversion layer 112, for example, a flattening film 113 is provided. It is to be noted that on the flattening film 113, a not-illustrated protective film may be provided, or the flattening film 113 may serve as a protective film.

On the flattening film 113, a scintillator layer 114 (a wavelength conversion layer) is disposed, and this scintillator layer 114 is covered with a protective film 115. There will be described below a detailed configuration of a main part of the pixel section 12.

(Pixel Circuit Configuration in Photoelectric Conversion Layer 112)

Figure 3:
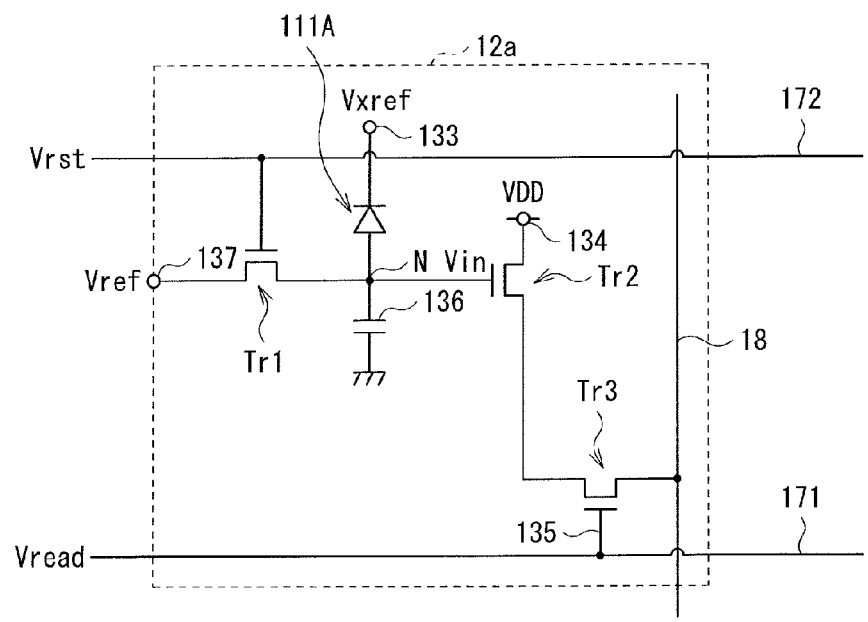
FIG. 3 is an example of a pixel drive circuit (an active drive circuit) in a photoelectric conversion section illustrated in FIG. 2.

FIG. 3 is an example of the circuit configuration of the unit pixel 12a in the photoelectric conversion layer 112. The unit pixel 12a includes the photodiode 111A (photoelectric conversion element) and transistors Tr1, Tr2, and Tr3 (equivalent to the transistor 111B to be described later), the above-described vertical signal line 18, and a row selection line 171 as well as a reset control line 172 serving as the pixel driving line 17.

The photodiode 111A is, for example, a PIN (Positive Intrinsic Negative Diode) photodiode, and, for example, its sensitivity range is a visible range (a light receiving wavelength band is a visible range). This photodiode 111A generates signal charge in the quantity of electric charge corresponding to the amount of incident light (the amount of received light) when a reference potential Vxref is applied to a cathode (a terminal 133). An anode of the photodiode 111A is connected to a storage node N. There is a capacitive component 136 in the storage node N, and the signal charge generated at the photodiode 111A is accumulated at the storage node N. It is to be noted that the photodiode 111A may be configured to be connected between the storage node N and a ground (GND). A cross section structure of this photodiode will be described later.

Each of the transistors Tr1, Tr2, and Tr3, is, for example, an N-channel field effect transistor, and a semiconductor layer (a semiconductor layer 126 to be described later) forming a channel is configured using, for example, a silicon system semiconductor such as amorphous silicon, microcrystalline silicon, or polycrystalline silicon, or desirably using a low-temperature polycrystalline silicon. Alternatively, the semiconductor layer may be configured using an oxide semiconductor such as indium gallium zinc oxide (InGaZnO) or zinc oxide (ZnO).

The transistor Tr1 is a reset transistor, and connected between a terminal 137 to which a reference potential Vref is applied and the storage node N. This transistor Tr1 resets the potential of the storage node N to the reference potential Vref by being turned on in response to a reset signal Vrst. The transistor Tr2 is a readout transistor, and, has a gate connected to the storage node N and a terminal 134 (a drain) connected to a power source VDD. This transistor Tr2 receives the signal charge generated in the photodiode 111A at the gate, and outputs a signal voltage corresponding to the received signal charge. The transistor Tr3 is a row selecting transistor, and connected between a source of the transistor Tr2 and the vertical signal line 18, and outputs a signal outputted from the transistor Tr2 to the vertical signal line 18 by being turned on in response to a row scanning signal Vread. This transistor Tr3 may be configured to be connected between the drain of the transistor Tr2 and the power source VDD. There will be described below a cross section structure of these transistors (hereinafter referred to the transistor 111B collectively).

(Cross Section Structure of Transistor 111B)

Figure 4:
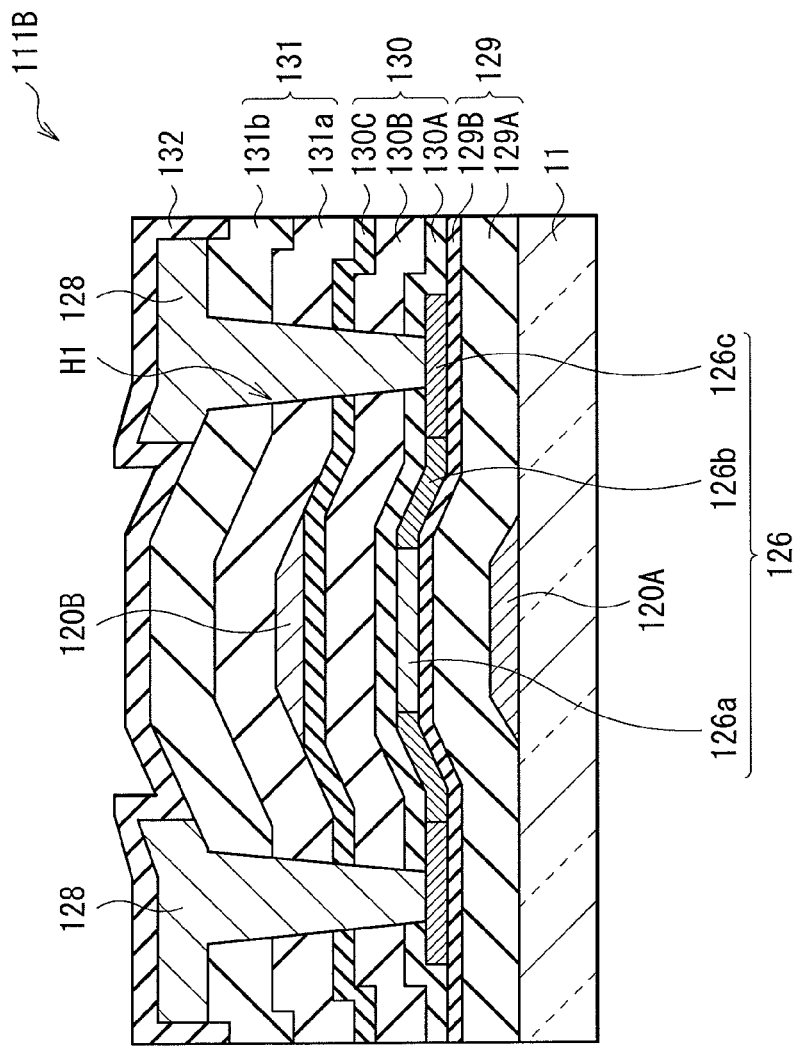
FIG. 4 is a schematic diagram illustrating a cross section structure of a transistor illustrated in FIG. 3.
Figure 5:
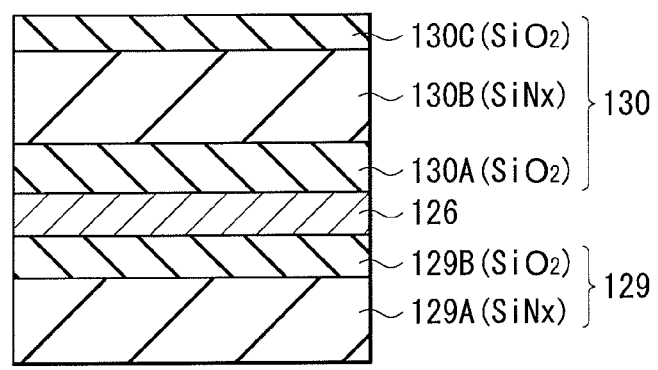
FIG. 5 is a schematic diagram for explaining a layered structure in proximity to a semiconductor layer of the transistor illustrated in FIG. 4.

FIG. 4 is an example of the cross section structure of the transistor 111B, and is equivalent to a part of a cross section structure of the photoelectric conversion layer 112. FIG. 5 schematically illustrates a layered structure of a part in proximity to the semiconductor layer 126 in FIG. 4.

The transistor 111B has a so-called dual-gate structure in which two gate electrodes are provided to sandwich the semiconductor layer 126. Specifically, the transistor 111B has, on the substrate 11, a first gate electrode 120A and a first gate insulator 129 formed to cover this first gate electrode 120A. On the first gate insulator 129, there is provided the semiconductor layer 126 including a channel layer 126a, a Lightly Doped Drain (LDD) layer 126b, and an N$^+$ layer 126c. A second gate insulator 130 is formed to cover this semiconductor layer 126, and a second gate electrode 120B is disposed in a region facing the first gate electrode 120A on this second gate insulator 130.

On the second gate electrode 120B, a first interlayer insulator 131 is formed, and a source-drain electrode 128 is formed to fill a contact hole H1 formed in this first interlayer insulator 131. Formed on these first interlayer insulator 131 and source-drain electrode 128 is a second interlayer insulator 132. There will be described below a detailed configuration of a main part in the transistor 111B.

Each of the first gate electrode 120A and the second gate electrode 120B is, for example, a single layer film made of any of Ti, Al, Mo, W, Cr, and the like, or a laminated film made of them. These first gate electrode 120A and second gate electrode 120B are disposed to face each other and sandwich the first gate insulator 129, the semiconductor layer 126, and the second gate insulator 130 as described above. The thickness of each of the first gate electrode 120A and the second gate electrode 120B is, for example, 30 nm to 150 nm, and, for example, the first gate electrode 120A has a thickness of 65 nm, and the second gate electrode 120B has a thickness of 90 nm.

Each of the first gate insulator 129 and the second gate insulator 130 is a single layer film made of a silicon compound film containing oxygen such as a silicon oxide ($SiO_2$) film or a silicon oxynitride (SiON) film, or a laminated film having such a silicon compound film containing oxygen and a silicon nitride ($SiN_x$) film. Here, as illustrated in FIG. 5, the first gate insulator 129 is a film in which a silicon nitride film 129A and a silicon oxide film 129B are laminated sequentially from the substrate 11 side, and the second gate insulator 130 is a film in which a silicon oxide film 130A, a silicon nitride film 130B, and a silicon oxide film 130C are laminated sequentially from the substrate 11 side. In this way, in proximity to the semiconductor layer 126, the silicon oxide films 129B and 130A are provided to sandwich the semiconductor layer 126. This is to prevent a shift in threshold voltage from occurring due to the semiconductor layer 126 upon being affected by an interface state.

In this way, the silicon oxide films (129B, 130A, 130C) are included in each of the first gate insulator 129 and the second gate insulator 130, but in the present embodiment, the sum total of the film thicknesses of these silicon oxide films 129B, 130A, and 130C is 65 nm or less.

However, the size relation of the film thicknesses (a combination of the film thicknesses) of the silicon oxide films 129B, 130A, and 130C is optional (for the details, refer to examples to be described later). Further, the number of the silicon oxide films (the number of layers) included in each of the first gate insulator 129 and the second gate insulator 130 may be one, or more than one. Furthermore, when, for example, a silicon oxynitride film is provided as the silicon compound film containing oxygen, the total sum including the film thickness of this silicon oxynitride film may be set to be 65 nm or less.

In addition, in the first gate insulator 129 and the second gate insulator 130, there are layers (the silicon nitride films 129A and 130B) other than the silicon oxide films 129B, 130A, and 130C, but the above-described film thickness is set without depending on the film thicknesses and the number of layers of these silicon nitride films 129A and 130B. However, a capacitor formed between the first gate electrode 120A and the second gate electrode 120B is determined by the materials or film thicknesses of the insulating films laminated therebetween and thus, the film thickness of each of the silicon oxide films 129B, 130A, and 130C as well as the silicon nitride films 129A and 130B is set to form a desired capacitor. In other words, in a structure where the total sum of the film thicknesses of the silicon oxide films 129B, 130A, and 130C is set to be 65 nm or less, the film thickness of each of the silicon nitride films 129A and 130B may be set to form a desirable capacitor between the first gate electrode 120A and the second gate electrode 120B.

The semiconductor layer 126 is made of, for example, polycrystalline silicon, low-temperature polycrystalline silicon, microcrystalline silicon, or amorphous silicon, and desirably made of low-temperature polycrystalline silicon. Alternatively, the semiconductor layer 126 may be made of an oxide semiconductor such as indium gallium zinc oxide (IGZO). In this semiconductor layer 126, the LDD layer 126b is formed between the channel layer 126a and the $N^+$ layer 126c, for the purpose of reducing a leakage current. The source-drain electrode 128 is a single layer film made of Ti, Al, Mo, W, Cr, or the like, or a laminated film made of them, and is connected to wiring for signal reading.

Each of the first interlayer insulator 131 and the second interlayer insulator 132 is configured by using, for example, a single layer film among a silicon oxide film, a silicon oxynitride film, and a silicon nitride film, or a laminated film thereof. Here, the first interlayer insulator 131 is a film in which a silicon oxide film 131a and a silicon nitride film 131b are sequentially laminated from the substrate 11 side, and the second interlayer insulator 132 is a silicon oxide film.

(Method of Producing Transistor 111B)

The transistor 111B as described above may be produced in the following manner, for example. FIGS. 6A to 9 are cross-sectional views for explaining a method of producing the transistor 111B in a process order.

Figure 6A:
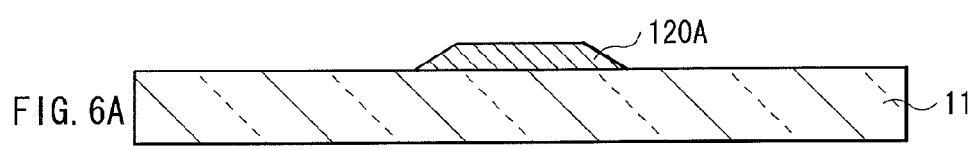
FIGS. 6A to 6C are cross-sectional schematic diagrams for explaining a method of producing the transistor illustrated in FIG. 4 in a process order.

First, as illustrated in FIG. 6A, the first gate electrode 120A is formed on the substrate 11. Specifically, a film of refractory metal such as Mo, for example, is formed on the substrate 11 by sputtering, for example, and then is patterned to be like an island (island-shaped) by using a photolithography method, for example.

Figure 6B:
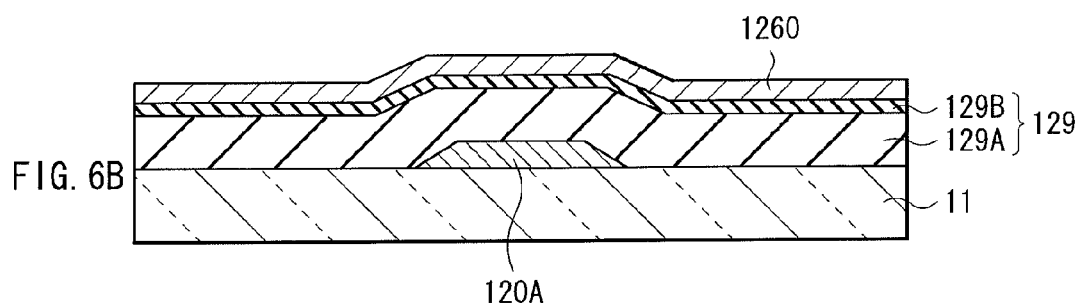

Subsequently, as illustrated in FIG. 6B, the first gate insulator 129 is formed. Specifically, to cover the first gate electrode 120A on the substrate 11, the silicon nitride film 129A and the silicon oxide film 129B each having a predetermined thickness are sequentially formed in this order by, for example, a CVD method. Subsequently, on the formed first gate insulator 129, for example, an amorphous silicon layer ($\alpha$-Si layer) 1260 to be the semiconductor layer 126 is formed by the CVD method.

Figure 6C:
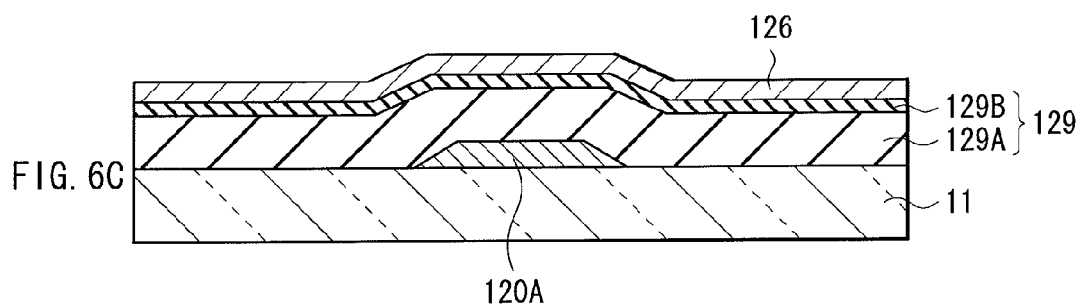

Next, as illustrated in FIG. 6C, the formed $\alpha$-Si layer 1260 is made to be polycrystalline, and thereby the semiconductor layer 126 is formed. Specifically, first, the $\alpha$-Si layer 1260 is subjected to a dehydrogenation treatment (anneal) at the temperature of 400° C. to 450° C., for example, so that the content of hydrogen becomes 1% or less. Subsequently, by irradiation of, for example, a laser beam having a wavelength of 308 nm by, for example, an excimer laser (ELA), the $\alpha$-Si layer 1260 is made to be polycrystalline. Then, the semiconductor layer 126 is formed by adjusting a threshold voltage by doping with boron, for example.

Figure 7A:
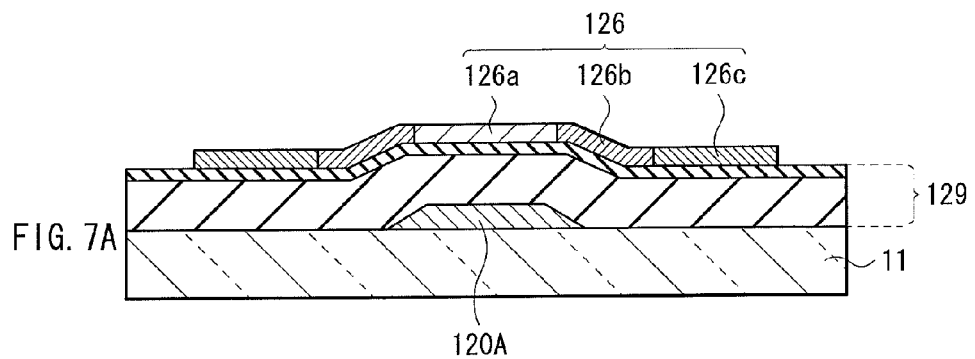
FIGS. 7A to 7C are cross-sectional diagrams each illustrating a process following FIGS. 6A to 6C.

Subsequently, as illustrated in FIG. 7A, in a predetermined region of the polycrystalline semiconductor layer 126, each of the LDD layer 126b and the $N^+$ layer 126c is formed by ion implantation.

Figure 7B:
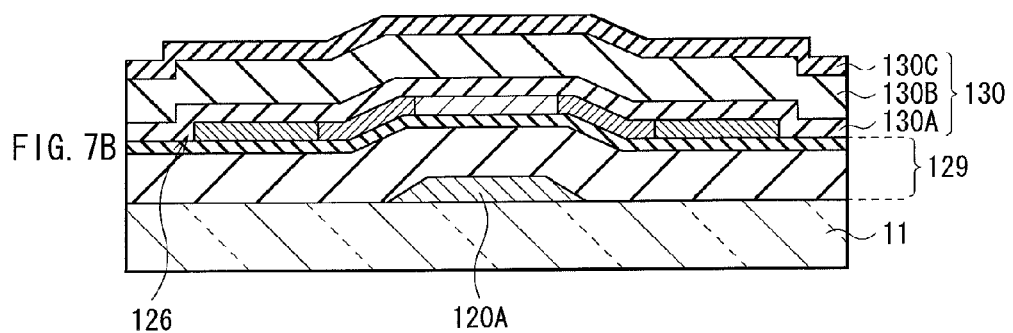

Next, as illustrated in FIG. 7B, the second gate insulator 130 is formed. Specifically, the silicon oxide film 130A, the silicon nitride film 130B, and the silicon oxide film 130C each having a predetermined film thickness are sequentially formed in this order by, for example, the CVD method, to cover the semiconductor layer 126. It is to be noted that the film thickness of each film is set so that the total sum of the film thicknesses of the silicon oxide films 130A and 130C and the silicon oxide film 129B in the first gate insulator 129 described above becomes 65 nm or less. Incidentally, after the formation of this third gate insulator 130, although not illustrated, there is formed a contact hole to electrically connect the above-described first gate electrode 120A to the second gate electrode 120B to be formed in a later process.

Figure 7C:
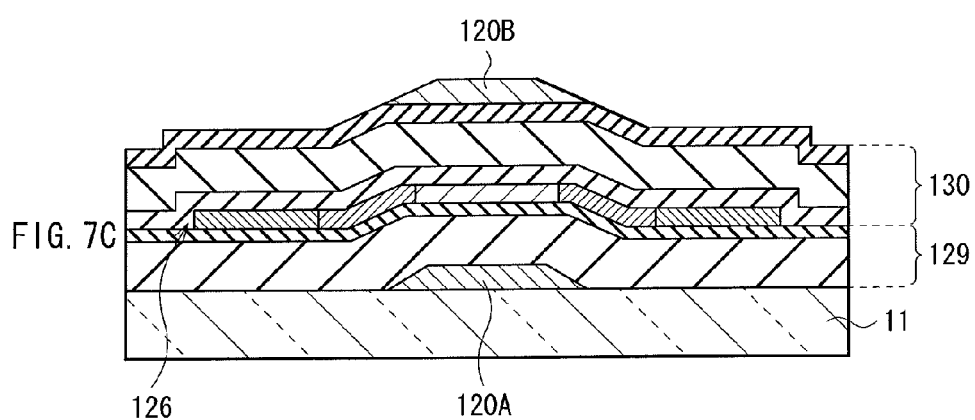

Subsequently, as illustrated in FIG. 7C, the second gate electrode 120B is formed on the second gate insulator 130. Specifically, a film of refractory metal such as Mo is formed on the second gate insulator 130 by sputtering, for example, and then is patterned to be shaped like an island by using the photolithography method.

Figure 8A:
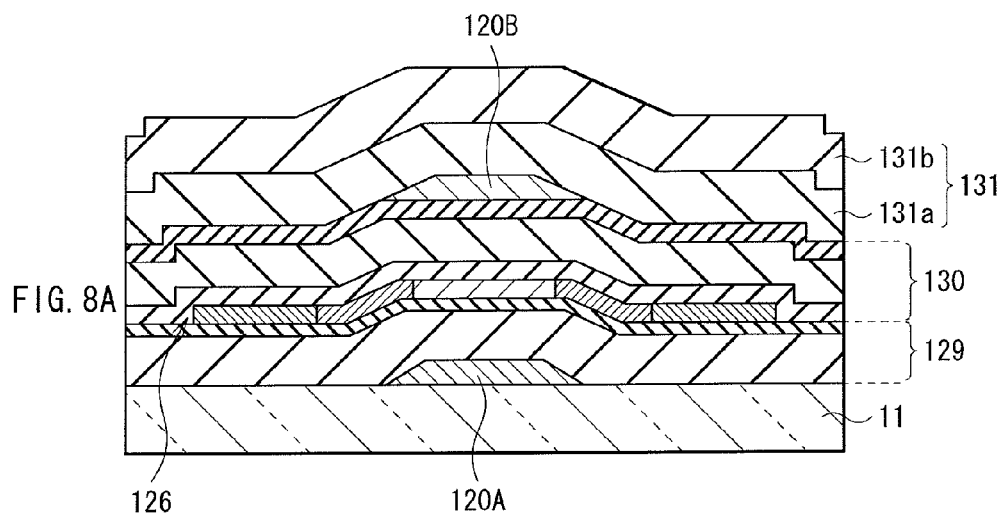
FIGS. 8A and 8B are cross-sectional diagrams illustrating a process following FIGS. 7A to 7C.

Next, as illustrated in FIG. 8A, the silicon oxide film 131a and the silicon nitride film 131b are sequentially formed in this order by the CVD method, for example, and thereby the first interlayer insulator 131 is formed.

Figure 8B:
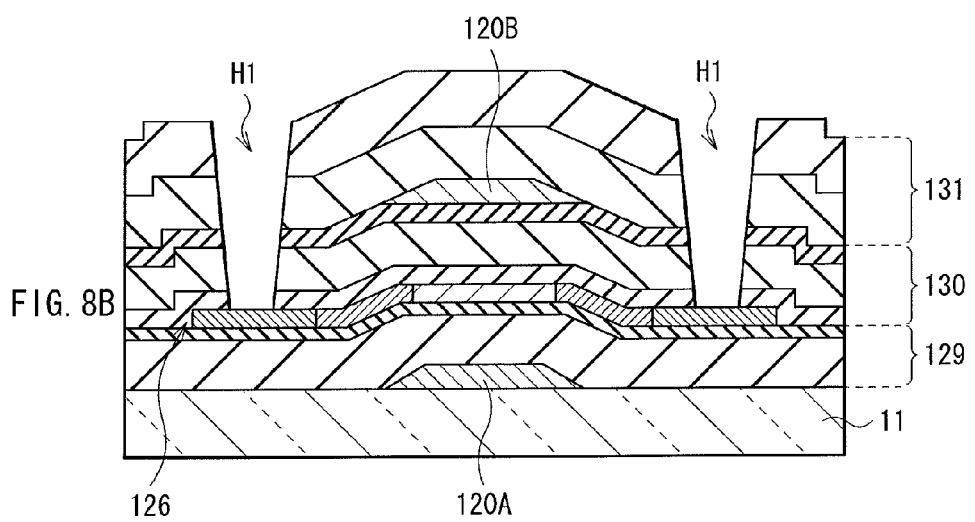

Subsequently, as illustrated in FIG. 8B, the contact hole H1 passing through the formed first interlayer insulator 131 and the second gate insulator 130 is formed by, for example, dry etching.

Figure 9:
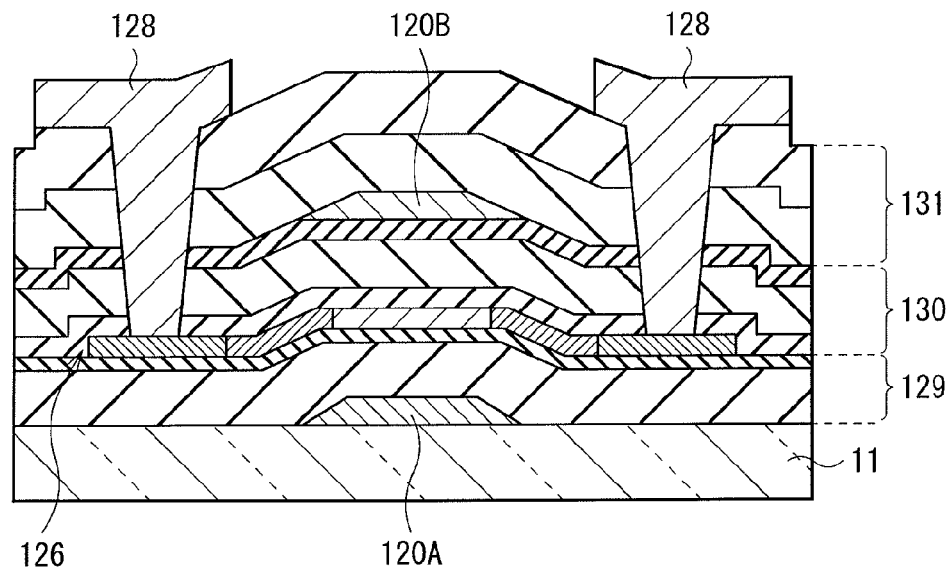
FIG. 9 is a cross-sectional diagram illustrating a process following FIGS. 8A and 8B.

Subsequently, as illustrated in FIG. 9, the source-drain electrode 128 is deposited by, for example, sputtering, to fill the contact hole H1, and patterned to have a predetermined shape. Finally, on this source-drain electrode 128 and the first interlayer insulator 131, a silicon oxide film is formed as the second interlayer insulator 132 by the CVD method, for example, and thereby the transistor 111B illustrated in FIG. 4 is completed.

(Cross Section Configuration of Photodiode 111A)

Figure 10:
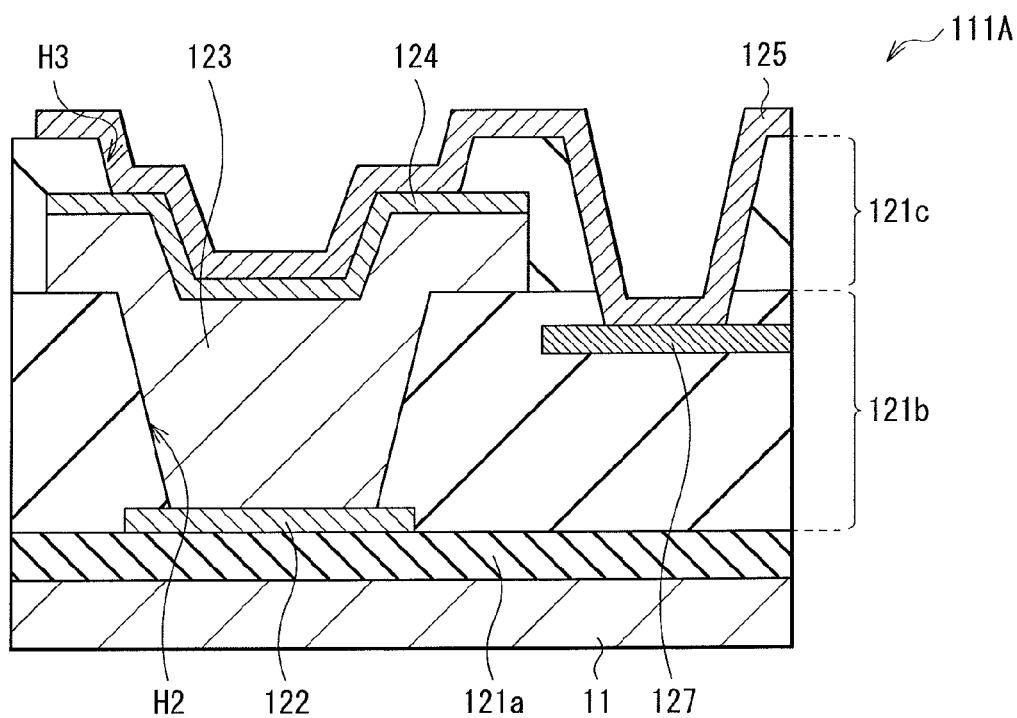
FIG. 10 is a schematic diagram illustrating a cross section structure of a photodiode illustrated in FIG. 3.

FIG. 10 is an example of the cross section configuration of the photodiode 111A, and corresponds to a part of the photoelectric conversion layer 112 illustrated in FIG. 2. This photodiode 111A is disposed on the substrate 11 with the transistor 111B described above, and a part of its layered structure is common with the transistor 111B and is formed by the same film process. There will be described below a detailed configuration of the photodiode 111A.

The photodiode 111A has a p-type semiconductor layer 122 via a gate insulator 121a, in a selective region on the substrate 11. On the substrate 11 (specifically, on the gate insulator 121a), there is provided a first interlayer insulator 121b having a contact hole H2 facing the p-type semiconductor layer 122. On the p-type semiconductor layer 122 in the contact hole H2 of the first interlayer insulator 121b, an i-type semiconductor layer 123 is provided, and an n-type semiconductor layer 124 is formed on this i-type semiconductor layer 123. The n-type semiconductor layer 124 is provided with a second interlayer insulator 121c having a contact hole H3, and the n-type semiconductor layer 124 and an upper electrode 125 are connected through the contact hole H3.

It is to be noted that here, there is taken an example in which the p-type semiconductor layer 122 is provided on the substrate side (the lower side), and the n-type semiconductor layer 124 is provided on the upper side. However, there may be adopted a reverse structure, i.e., a structure in which an n-type is provided on the lower side (the substrate side) and a p-type is provided on the upper side. Further, the gate insulator 121a, the first interlayer insulator 121b, and the second interlayer insulator 121c have, in a part or all thereof, the same layer structure as that of each of the first gate insulator 129, the second gate insulator 130, and the first interlayer insulator 131 in the transistor 111B. This photodiode 111A may be formed by the same film process as that of the transistor 111B.

The p-type semiconductor layer 122 is a p+ region in which, for example, polycrystalline silicon (polysilicon) is doped with boron (B) and the like, and the thickness is, for example, 40 nm to 50 nm. This p-type semiconductor layer 122 also serves as a lower electrode (anode) to read signal charge, for example, and is connected to the above-described storage node N (FIG. 3), (or the p-type semiconductor layer 122 becomes the storage node N, and allows electric charge to accumulate).

The i-type semiconductor layer 123 is a semiconductor layer showing middle conductivity between p-type and n-type, e.g., a non-doped intrinsic semiconductor layer, and is made of, for example, noncrystalline silicon (amorphous silicon). The thickness of the i-type semiconductor layer 123 is, for example, 400 nm to 1,000 nm, but the larger the thickness is, the higher the photosensitivity may be. The n-type semiconductor layer 124 is made of, for example, noncrystalline silicon (amorphous silicon), and forms an n+ region. The thickness of this n-type semiconductor layer 124 is, for example, 10 nm to 50 nm.

The upper electrode 125 (cathode) is an electrode to supply a reference potential for photoelectric conversion, and configured using, for example, a transparent conductive film such as ITO (Indium Tin Oxide). To this upper electrode 125, a power supply wire 127 to supply a voltage to this upper electrode 125 is connected. The power supply wire 127 is made of a material having resistance lower than the upper electrode 125, such as Ti, Al, Mo, W, or Cr.

(Flattening Film 113)

The flattening film 113 is formed to flatten a part on the substrate 11 where the photodiode 111A and the transistor 111B as described above (the photoelectric conversion layer 112) are formed, and is configured using an organic film.

(Scintillator Layer 114)

The scintillator layer 114 performs wavelength conversion of radiation into light in the sensitivity range of the photodiode 111A. In this scintillator layer 114, for example, a fluorescent substance that converts X-rays into visible light is used. As such a fluorescent substance, there are, for example, cesium iodide (CsI) with thallium (Tl) added, gadolinium oxide sulfide ($Gd_2O_2S$) with terbium (Tb) added, BaFX (X is Cl, Br, I, or the like), and the like. The thickness of the scintillator layer 114 is desirably 100 μm to 600 μm, and is, for example, 600 μm. Such a scintillator layer 114 may be formed on the flattening film 113 by using, for example, vacuum deposition.

(Protective Film 115)

The protective film 115 is, for example, an organic film made of parylene C. The fluorescent substance material used for the scintillator layer 114, like those described above, particularly, CsI, deteriorates easily due to water. Therefore, it is desirable that the protective film 115 be provided on the scintillator layer 114, as a barrier layer to water.

[Operation and Effects]

Operation and effects of the present embodiment will be described with reference to FIG. 1 to FIG. 5 and FIG. 10 to FIG. 13. In the radiation imaging device 1, radiation (e.g., X-rays) is emitted from an irradiation source not illustrated, the radiation having passed through a subject (a detected body) is acquired, and this radiation is subjected to photoelectric conversion after undergoing wavelength conversion, and thereby an image of the subject is obtained as electric signals. Specifically, the radiation entering the radiation imaging device 1 is first converted into a wavelength of the sensitivity range (here, the visible range) of the photodiode 111A, in the scintillator layer 114 provided on the pixel section 12. Subsequently, upon leaving the scintillator layer 114, this light after the wavelength conversion passes through the flattening film 113, and enters the photoelectric conversion layer 112.

In the photoelectric conversion layer 112, when a predetermined electric potential is applied to the photodiode 111A from a not-illustrated power supply wire via the upper electrode 125, light entering from the upper electrode 125 side is converted into signal charge of the quantity of electric charge corresponding to the amount of the received light (the photoelectric conversion is performed). The signal charge generated by this photoelectric conversion is retrieved as a photoelectric current from the p-type semiconductor layer 122 side.

Specifically, the electric charge generated by the photoelectric conversion in the photodiode 111A is collected by an accumulation layer (the p-type semiconductor layer 122, the storage node N) and read as an electric current from this accumulation layer, and applied to the gate of the transistor Tr2 (the readout transistor). The transistor Tr2 outputs a signal voltage corresponding to the signal charge. When the transistor Tr3 is turned on in response to the row scanning signal Vread, the signal outputted from the transistor Tr2 is outputted to the vertical signal line 18 (read out). The read-out signal is outputted to the horizontal selection section 14 via the vertical signal line 18 for every pixel column.

In the present embodiment, in the manner described above, the electric signal (picked-up image data) is obtained by the wavelength conversion and the photoelectric conversion of the incident radiation (X-rays). However, on the other hand, there is light passing through the scintillator layer 114, without undergoing the wavelength conversion in the scintillator layer 114. When such radiation enters the photoelectric conversion layer 112, the following malfunction occurs, in particular, in the transistor 111B. In other words, the transistor 111B includes the silicon oxide films in the first gate insulator 129 and the second gate insulator 130, but in a case where such a film containing oxygen is included, electrons in the film are excited by photoelectric effect, Compton scattering, or electron pair production when the radiation enters there. As a result, positive holes are trapped at an interface or a defect and remain (charged), and a threshold voltage (Vth) shifts to the negative side due to this "positive" charge.

COMPARATIVE EXAMPLE

Figure 11:
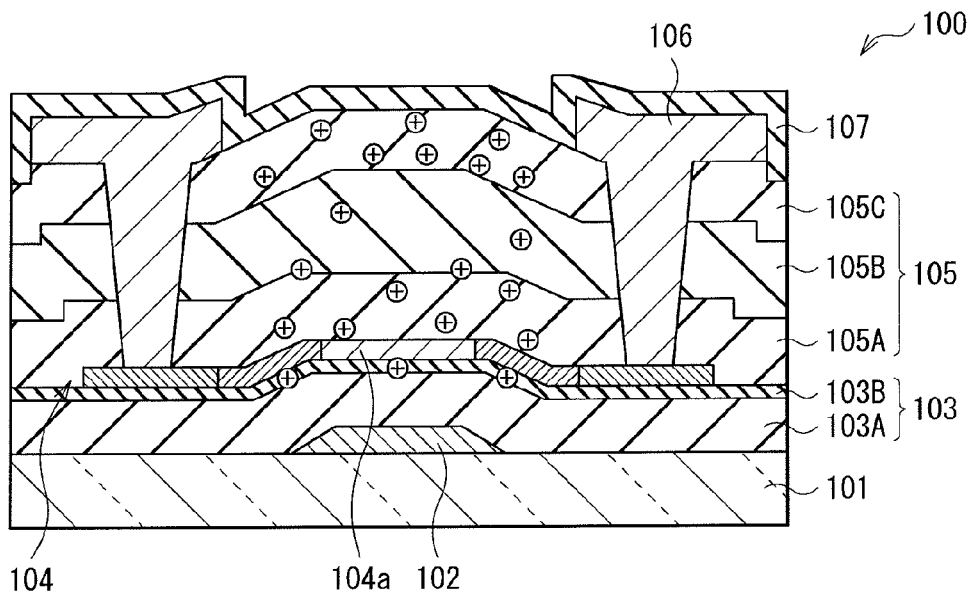
FIG. 11 is a schematic diagram for explaining a charge quantity of positive holes in a transistor according to a comparative example.

Here, a cross section structure of a transistor (a transistor 100) according to a comparative example of the present embodiment is illustrated in FIG. 11. The transistor 100 includes a gate electrode 102, a gate insulator 103, a semiconductor layer 104 including a channel layer 104a, and a first interlayer insulator 105 are provided on a substrate 101 in this order. The first interlayer insulator 105 has a contact hole, and a source-drain electrode 106 is connected to the semiconductor layer 104 via this contact hole. On the source-drain electrode 106 and the first interlayer insulator 105, a second interlayer insulator 107 is formed. In such a configuration, the gate insulator 103 is a film in which a silicon nitride film 103A and a silicon oxide film 103B are sequentially laminated from the substrate 101 side. The first interlayer insulator 105 is a film in which a silicon oxide film 105A, a silicon nitride film 105B, and a silicon oxide film 105C are sequentially laminated from the substrate 11 side.

In other words, in the transistor 100 of this comparative example, which is a so-called bottom-gate structure, not the dual-gate structure as in the present embodiment, a gate voltage is applied by the single gate electrode 102. In such a configuration, positive holes are charged over a wide area of the silicon oxide layers 103B, 105A, and 105C (a charge quantity is large), affecting the channel layer 104a to a great extent. Therefore, a threshold voltage largely shifts to the negative side.

Figure 12:
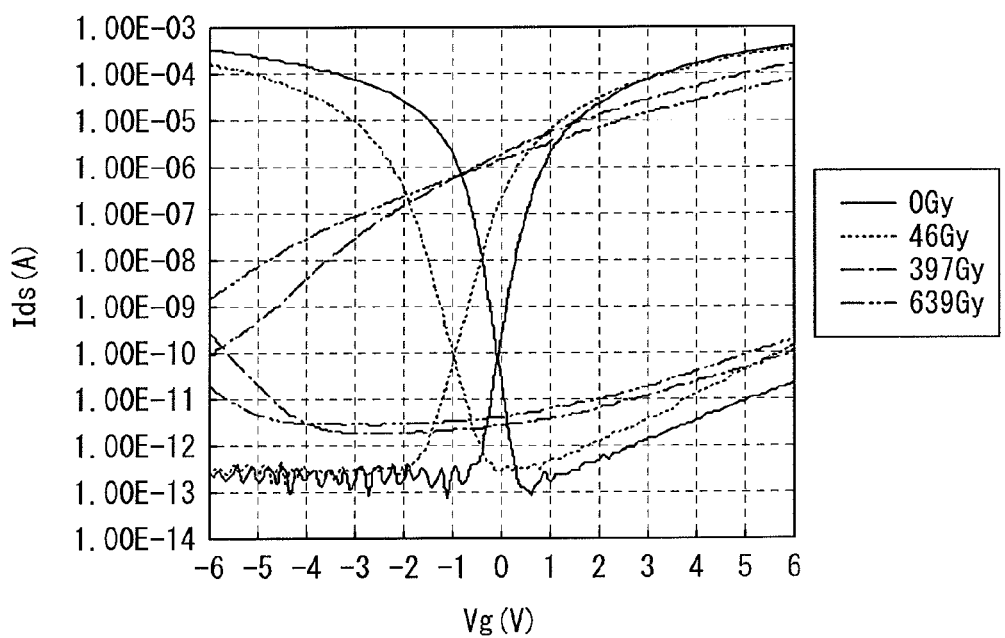
FIG. 12 is a characteristic diagram for explaining deterioration of transistor properties due to irradiation of radiation.

FIG. 12 illustrates a relationship of a drain electric current with the gate voltage (current-voltage characteristics), when the transistor using low-temperature polysilicon is irradiated with radiation. As illustrated, it is found that when the radiation is emitted, the threshold voltage shifts to the negative side, and a shift amount of the threshold voltage becomes large as the amount of irradiation increases like 0 Gy, 46 Gy, 397 Gy, and 639 Gy. Further, it is apparent that when the amount of irradiation increases (397 Gy, 639 Gy), an S (subthreshold swing) value deteriorates. Furthermore, this increase in the shift amount causes a change in an on-state current and an off-state current. For example, the off-state current may increase to cause a current leakage, the on-state current may decrease to disable readout, or a similar event may occur, and thus it is difficult to maintain the reliability of the transistor.

Figure 13:
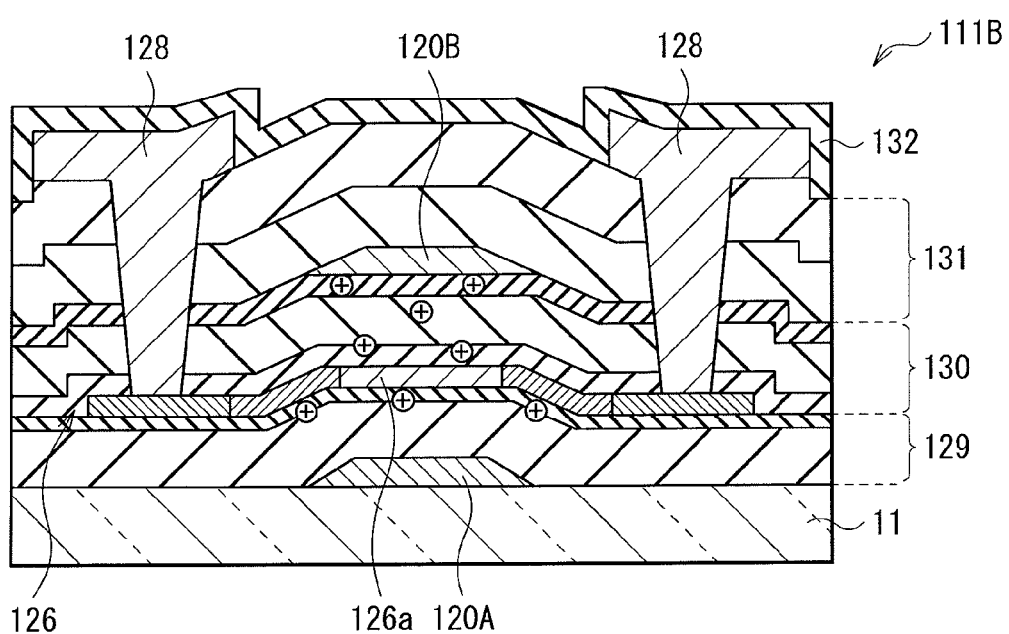
FIG. 13 is a schematic diagram for explaining a charge quantity of positive holes in the transistor illustrated in FIG. 5.

In contrast, in the present embodiment, the dual-gate structure is provided, and a design is achieved so that the total sum of the film thicknesses of the silicon oxide films is 65 nm or less, in the first gate insulator 129 and the second gate insulator 130 between which the semiconductor layer 126 is interposed. As a result, the film thicknesses of the silicon oxide films are optimized, and when X-rays are incident as illustrated in FIG. 13, for example, a region affecting the channel layer 126a falls within a narrow range between the first gate electrode 120A and the second gate electrode 120B. As a result, the charge quantity of the positive holes is reduced, and the shift of the threshold voltage is suppressed. It is to be noted that the film thickness of around 65 nm is an inflection point of the change in the shift amount, but this is also largely affected by the fact that the S value deteriorates (increases) as the film thickness increases.

As described above, in the present embodiment, the transistor 111B has the first gate electrode 120A, the first gate insulator 129, the semiconductor layer 126, the second gate insulator 130, and the second gate electrode 120B on the substrate 11 in this order, and the design is achieved so that the total sum (total) of the film thicknesses of the respective $SiO_2$ films in the first gate insulator 129 and the second gate insulator 130 is 65 nm or less. By such optimization of the film thicknesses of the $SiO_2$ films, the charge quantity of the positive holes is effectively reduced, and the shift in the threshold voltage due to the radiation exposure may be suppressed.

Examples

Here, as examples, in the transistor structure illustrated in FIG. 4, the film thickness of each layer of the first gate insulator 129 and the second gate insulator 130 was changed, and a shift amount ($\Delta$Vth) of the threshold voltage was measured. Specifically, as illustrated in FIG. 14, as examples 1 to 5, the threshold voltage was measured for each case where the total sum (the total $SiO_2$) of the film thicknesses of the $SiO_2$ films was each of 10 nm, 40 nm, 55 nm, and 65 nm.

Specifically, in the example 1, the $SiO_2$ film 129B in the first gate insulator 129 was 5 nm, and in the second gate insulator 130, the $SiO_2$ film 130A was 5 nm and the $SiO_2$ film 130C was 0 nm. In the example 2, the $SiO_2$ films 129B, 130A, and 130C were 35 nm, 5 nm, and 0 nm, respectively. In each of the examples 3 and 4, the total sum of the $SiO_2$ films was 55 nm, but the contents of each film were changed and measured. In the example 3, the $SiO_2$ films 129B, 130A, and 130C were 5 nm, 30 nm, and 20 nm, respectively, and in the example 4, the $SiO_2$ films 129B, 130A, and 130C were 35 nm, 20 nm, and 0 nm, respectively. In the example 5, the $SiO_2$ films 129B, 130A, and 130C were 5 nm, 40 nm, and 20 nm, respectively.

It is to be noted that Mo having a film thickness of 65 nm was used as the gate electrode 120A, Mo having a film thickness of 90 nm or 120 nm was used as the gate electrode 120B, and low-temperature polysilicon (p-Si) having a film thickness of 43 nm was used as the channel layer 126a. Further, in the case of the measurement described above, a tube voltage was set at 140 kV, and the amount of X-ray irradiation was set at 180 Gy. As the shift amount $\Delta$Vth of the threshold voltage, with reference to the case where the amount of X-ray irradiation was 0 Gy, the amount of change in the gate voltage Vg (V) to the negative side at the time when a drain electric current Ids (A) was 1E-10A was listed.

Further, as comparative examples (the comparative examples 1 to 3) with respect to the examples 1 to 5 described above, the threshold voltage was measured on the similar conditions except the film thickness, for each case where the total sum of the film thicknesses of the $SiO_2$ films was each of 70 nm, 85 nm, and 95 nm. In the comparative example 1, the SiO$_2$ films 129B, 130A, and 130C were 35 nm, 20 nm, and 15 nm, respectively. Further, in the comparative example 2, the SiO$_2$ films 129B, 130A, and 130C were 35 nm, 30 nm, and 20 nm, respectively, and in the comparative example 3, the SiO$_2$ films 129B, 130A, and 130C were 35 nm, 40 nm, and 20 nm, respectively.

As a result, in the examples 1 to 5 in each of which the total sum of the SiO$_2$ film thicknesses was 65 nm or less, the shift amounts ΔVth of the threshold voltage were 1.07, 1.20, 1.41, 1.41, and 1.34, respectively. On the other hand, in the comparative examples 1 to 3, the shift amounts ΔVth were 1.49, 2.74, and 2.88, respectively. The relationship between these total sums of film thicknesses and the shift amounts ΔVth is illustrated in FIG. 15.

Figure 15:
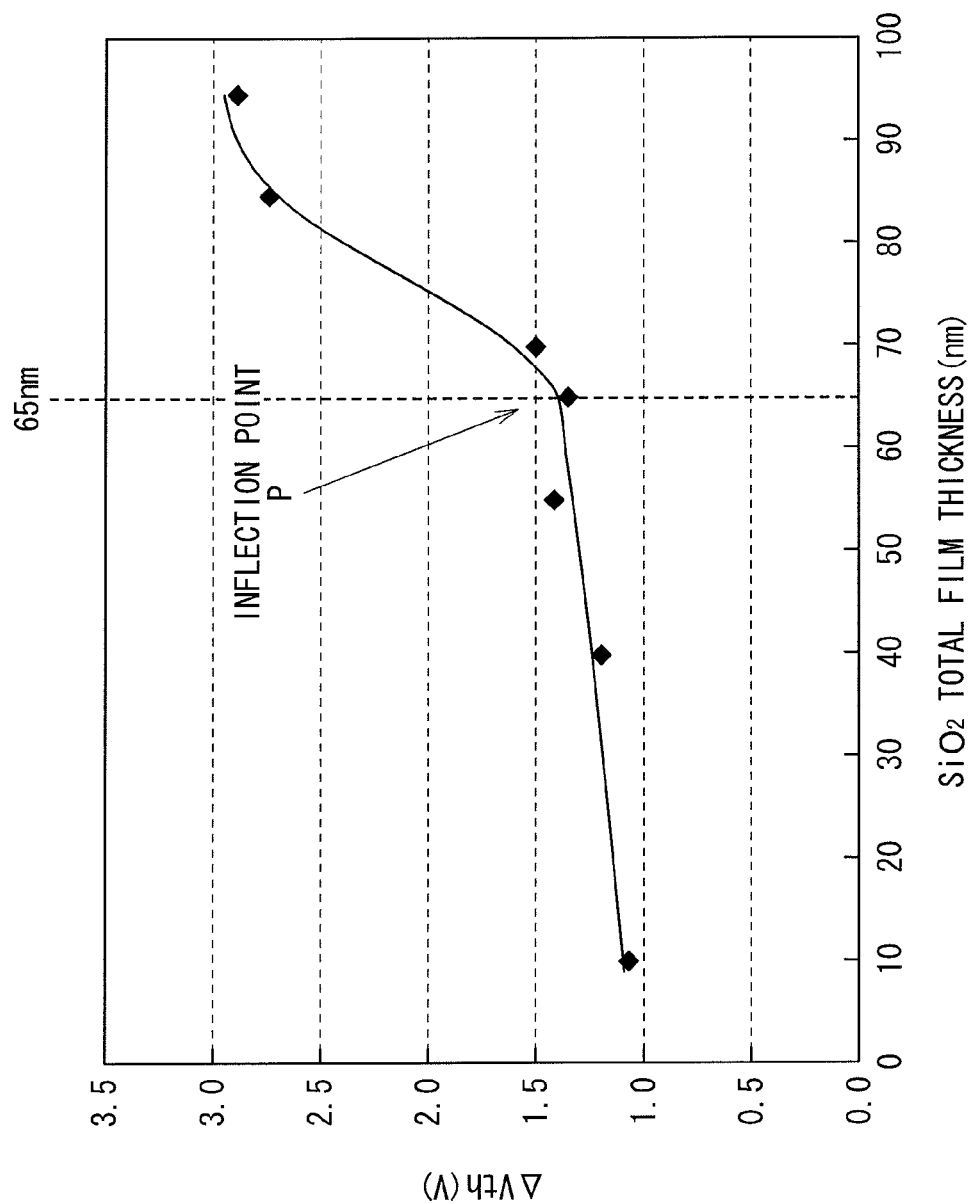
FIG. 15 is a characteristic diagram illustrating a shift amount in threshold voltage in the examples 1 to 5 and the comparative examples 1 to 3.

As illustrated in FIG. 15, it is found that for the total film thickness of 65 nm or less, the shift amount ΔVth is relatively small, and the shift amount ΔVth does not change greatly even when the total film thickness increases. However, when the total film thickness exceeds 65 nm, the shift amount ΔVth suddenly increases. From this result, it is apparent that the threshold voltage greatly changes, at the total film thickness of 65 nm serving as an inflection point (a border) P. In other words, a range of optimum total SiO$_2$ film thickness in the gate insulator is found, and the shift of the threshold voltage may be effectively suppressed by meeting this film thickness range.

It is to be noted that as long as the total sum of the SiO$_2$ films 129B, 130A, and 130C described above is 65 nm or less, suppression of the shift in the threshold voltage is achieved, and the breakdown (the ratio) of each film does not matter. This is because a threshold voltage shift occurs due to the total positive-hole charge quantity of all the SiO$_2$ films provided in the gate insulator. In addition, this is also apparent from the results of the examples 3 and 4 (the fact that when the total film thicknesses are the same (55 nm), the shift amounts are the same (1.41) even when the breakdown of each SiO$_2$ film is changed).

Figure 16:
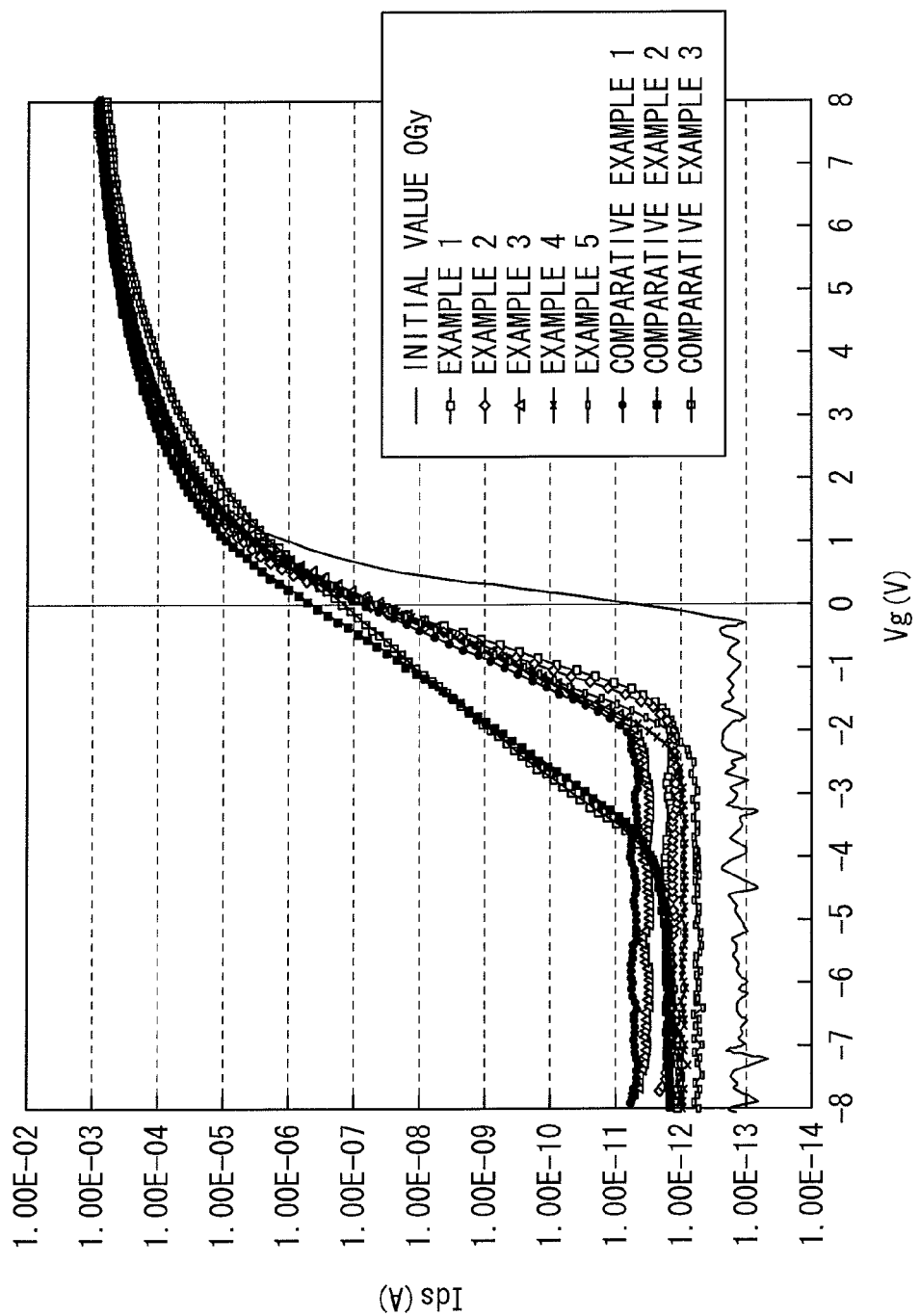
FIG. 16 is a characteristic diagram illustrating a relationship between the amount of X-ray irradiation and current-voltage characteristics in the examples 1 to 5 and the comparative examples 1 to 3.
Figure 17:
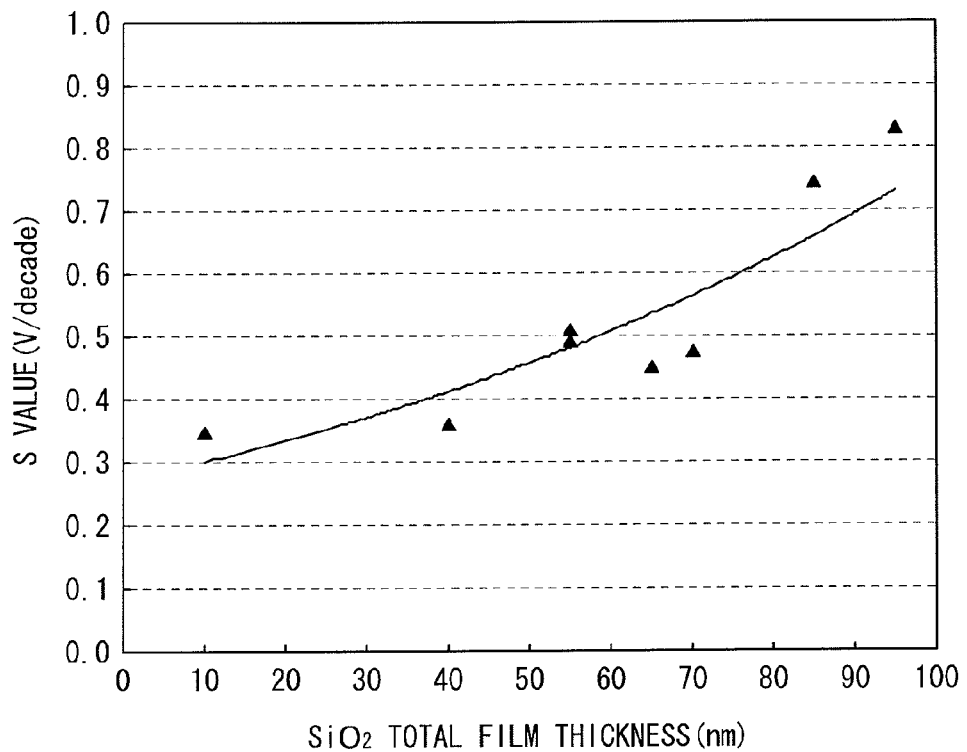
FIG. 17 is a diagram illustrating S values in the current-voltage characteristics of the examples 1 to 5 and the comparative examples 1 to 3.

Further, FIG. 16 illustrates the current-voltage characteristics (the amount of X-ray irradiation: 180 Gy) in each of the examples 1 to 5 and the comparative examples 1 to 3 described above. It is to be noted that the case of 0 Gy (no X-ray irradiation) as an initial value is also illustrated. FIG. 17 illustrates a graph in which the S values (here, a difference in gate voltage Vg between drain electric currents 1E-10A and 1E-9A) are plotted about in each of the examples 1 to 5 and the comparative examples 1 to 3 described above. As illustrated in FIG. 16 and FIG. 17, it is found that in the examples 1 to 5 in each of which the film thickness is 65 nm or less, deterioration of the S value is reduced as compared to the comparative examples 1 to 3. Such a change in the S value before and after the film thickness of 65 nm also does not a little affect the formation of the inflection point P in the threshold voltage shift described above.

[Modification 1]

Figure 18:
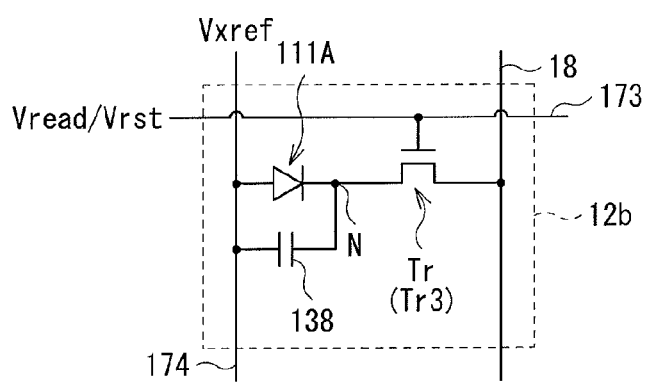
FIG. 18 is an example of a pixel drive circuit (a passive drive circuit) according to a modification 1.

For the embodiment described above, there has been described the example in which the drive circuit of the pixel is configured by using the active drive circuit, but the drive circuit may be a passive drive circuit as illustrated in FIG. 18. It is to be noted that the same elements as those of the above-described embodiment will be provided with the same reference characters, and the description will be omitted. In the present modification, a unit pixel 12b is configured to include a photodiode 111A, a capacitive component 138, and a transistor Tr (equivalent to the transistor Tr3 for reading). The transistor Tr is connected between a storage node N and a vertical signal line 18, and upon being tuned on in response to a row scanning signal Vread, outputs signal charge accumulated at the storage node N based on the amount of light received in the photodiode 111A, to the vertical signal line 18. In this way, the drive system of the pixels is not limited to the active drive system described above for the embodiment, and may be the passive drive system as in the present modification.

[Modification 2]

Figure 19:
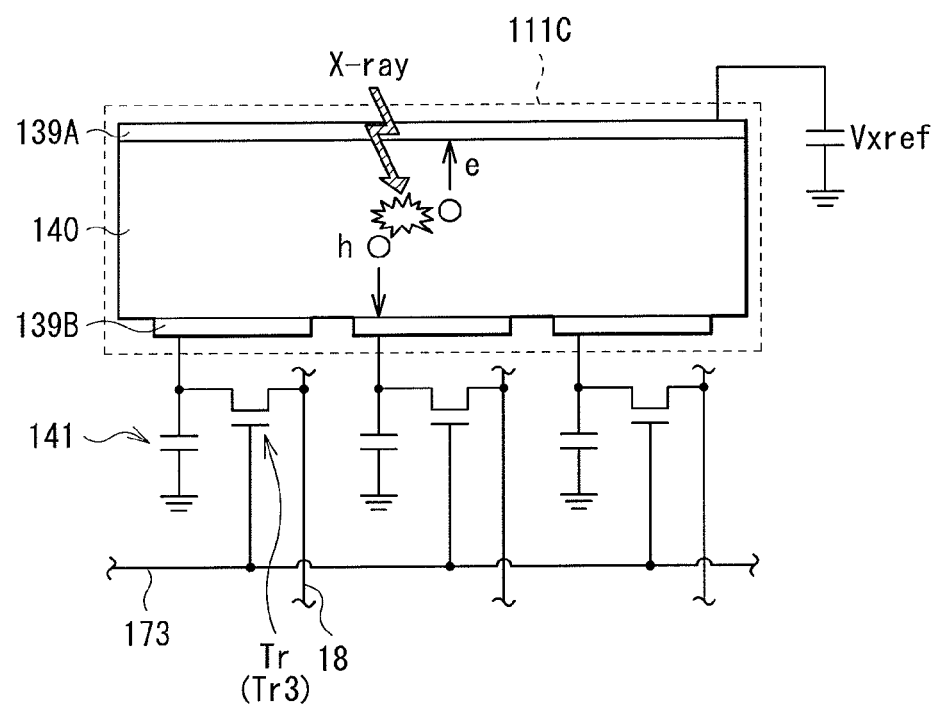
FIG. 19 is a schematic diagram for explaining a radiation imaging device of a direct conversion type according to a modification 2.

In the embodiment described above, the indirect conversion type FPD in which the scintillator layer 114 is provided on the pixel section 12 has been taken as an example of the radiation imaging device, but the radiation imaging device of the embodiment is applicable to a direct conversion type FPD. In other words, the scintillator layer 114 (and the protective film 115) performing the wavelength conversion of converting the radiation into the visible light may not be provided, and the pixel section 12 may have the function of directly converting the radiation into the electric signal. FIG. 19 illustrates an example thereof (here, there is taken an example employing the pixel section using the passive drive circuit described in the modification 1). In the present modification, the pixel section 12 includes a photoelectric conversion element 111C, a capacitive component 141, and a transistor Tr (equivalent to the transistor Tr3 for reading), and the conversion of the radiation into the electric signal is performed in the photoelectric conversion element 111C. The photoelectric conversion element 111C has, for example, a direct conversion layer 140 between an upper electrode 139A and a pixel electrode 139B, and the direct conversion layer 140 is configured by using, for example, an amorphous selenium semiconductor (a-Se), or a cadmium tellurium semiconductor (CdTe).

In such a direct conversion type FPD, like the above-described embodiment, the charge quantity of the positive holes may also be reduced to thereby suppress the threshold voltage shift, by adopting the dual-gate structure in the transistor, and setting the total sum of the SiO$_2$ films in the gate insulator at 65 nm or less. Therefore, effects similar to those of the above-described embodiment may be obtained. In particular, in the present modification, unlike the above-described embodiment, the radiation is allowed to directly enter the pixel section 12 and thus, the transistor is more easily exposed to the radiation than the above-described embodiment. Therefore, the effects of suppressing the threshold voltage shift due to the radiation exposure as described above is particularly effective in the radiation imaging device of the direct conversion type as in the present modification.

APPLICATION EXAMPLE

Figure 20:
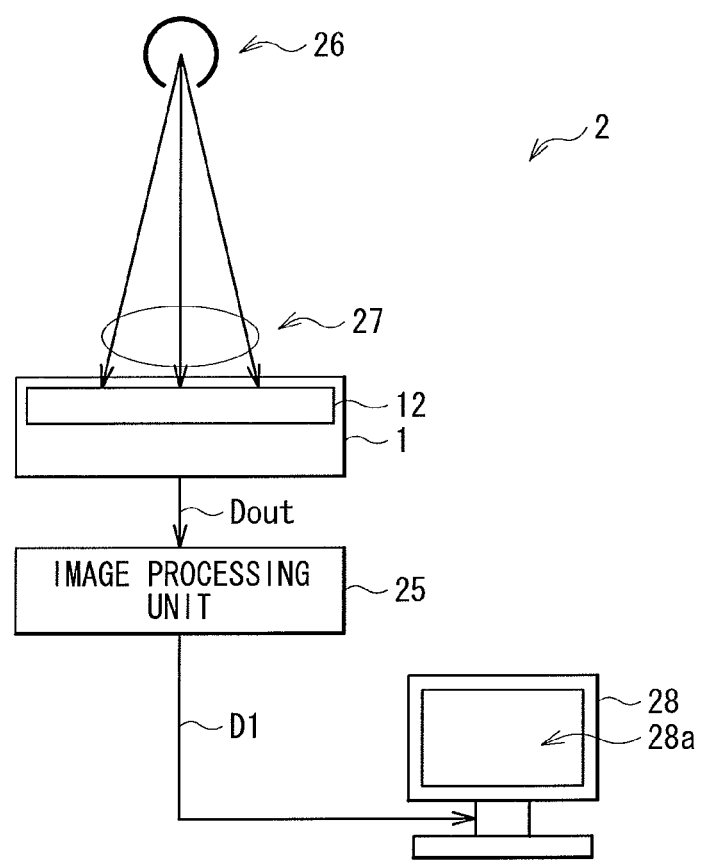
FIG. 20 is a schematic diagram illustrating an overall configuration of a radiation imaging display system according to an application example.

The radiation imaging device 1 described in each of the embodiment and the modifications 1 and 2 is applicable to, for example, a radiation imaging display system 2 illustrated in FIG. 20. The radiation imaging display system 2 includes the radiation imaging device 1, an image processing unit 25, and a display unit 28. By such a configuration, in the radiation imaging display system 2, the radiation imaging device 1 acquires image data Dout of a subject 27, based on radiation emitted to the subject 27 from an X-ray source 26, and outputs the image data Dout to the image processing unit 25. The image processing unit 25 performs predetermined image processing on the inputted image data Dout, and outputs image data (display data D1) after the image processing to the display unit 28. The display unit 28 has a monitor screen 28a, and displays an image based on the display data D1 inputted from the image processing unit 25 on the monitor screen 28a.

In this way, in the radiation imaging display system 2, the radiation imaging device 1 may obtain the image of the subject 27 as an electric signal and thus, image display may be performed by transmission of the obtained electric signal to the display unit 28. In other words, it is possible to observe the image of the subject 27 without using a radiographic film, and support moving-image photography and moving-image display.

Up to this point, the present technology has been described using the embodiment and the modifications, but the present technology may be variously modified, without being limited to the above-described embodiment and the like. For example, the wavelength conversion material used for the scintillator layer 114 described in the embodiment is not limited to those described above, and other various fluorescent substance materials may be used.

In addition, in the embodiment described above, the photodiode 111A has the structure in which the p-type semiconductor layer, the i-type semiconductor layer, and the n-type semiconductor layer are sequentially laminated from the substrate side, but the n-type semiconductor layer, the i-type semiconductor layer, and the p-type semiconductor layer may be laminated in this order from the substrate side.

Further, the radiation imaging device of the present disclosure may not have all the elements described above for the embodiment, and instead may include other layers. For example, a protective film made of SiN or the like may be further formed on the upper electrode 125.

The present disclosure contains subject matter related to that disclosed in Japanese Priority Patent Application JP 2011-003742 filed in the Japan Patent Office on Jan. 12, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A transistor comprising:
a first gate electrode, a first gate insulator, a semiconductor layer, a second gate insulator, and a second gate electrode in this order on a substrate,
wherein,
each of the first and second gate insulators includes one or a plurality of silicon compound films having oxygen, and
a total sum of thicknesses of the one or the plurality of silicon compound films of both of the first and the second gate insulators is 10 nm or more and 65 nm or less.

2. The transistor according to claim 1, wherein the silicon compound film is a silicon oxide film.

3. The transistor according to claim 2,
wherein,
the first gate insulator is a laminate in which a silicon nitride film and a silicon oxide film are laminated sequentially from the substrate side, and
the second gate insulator is a laminate in which a silicon oxide film, a silicon nitride film, and a silicon oxide film are laminated sequentially from the first gate electrode side.

4. The transistor according to claim 1, wherein the semiconductor layer is made of polycrystalline silicon, microcrystalline silicon, amorphous silicon, or an oxide semiconductor.

5. The transistor according to claim 4, wherein the semiconductor layer is made of low-temperature polycrystalline silicon.

6. The transistor according to claim 1, wherein the first gate insulator is in direct contact with the semiconductor layer and the second gate insulator.

7. The transistor according to claim 6, wherein each of the first gate electrode, the first gate insulator, the semiconductor layer, the second gate insulator, and the second gate electrode are successively layered in direct contact with each other on the substrate.

8. A radiation imaging device comprising:
a pixel section including a transistor and a photoelectric conversion element,
wherein,
the transistor includes a first gate electrode, a first gate insulator, a semiconductor layer, a second gate insulator, and a second gate electrode in this order on a substrate,
each of the first and second gate insulators includes one or a plurality of silicon compound films having oxygen, and
a total sum of thicknesses of the one or the plurality of silicon compound films of both of the first and the second gate insulators is 10 nm or more and 65 nm or less.

9. The radiation imaging device according to claim 8, wherein the silicon compound film is a silicon oxide film.

10. The radiation imaging device according to claim 9,
wherein,
the first gate insulator is a laminate in which a silicon nitride film and a silicon oxide film are laminated sequentially from the substrate side, and
the second gate insulator is a laminate in which a silicon oxide film, a silicon nitride film, and a silicon oxide film are laminated sequentially from the first gate electrode side.

11. The radiation imaging device according to claim 8, wherein the semiconductor layer is made of polycrystalline silicon, microcrystalline silicon, amorphous silicon, or an oxide semiconductor.

12. The radiation imaging device according to claim 11, wherein the semiconductor layer is made of low-temperature polycrystalline silicon.

13. The radiation imaging device according to claim 8, further comprising:
a wavelength conversion layer (i) on the pixel section, and (ii) operable to convert a wavelength of radiation into a wavelength in a sensitivity range of the photoelectric conversion element.

14. The radiation imaging device according to claim 8, wherein the photoelectric conversion element is operable to absorb and convert radiation into an electric signal.

15. The radiation imaging device according to claim 8, wherein the first gate insulator is in direct contact with the semiconductor layer and the second gate insulator.

16. The radiation imaging device according to claim 15, wherein each of the first gate electrode, the first gate insulator, the semiconductor layer, the second gate insulator, and the second gate electrode are successively layered in direct contact with each other on the substrate.

17. A radiation imaging display system comprising:
an imaging device acquiring an image based on radiation, and a display device displaying the image acquired by the imaging device,
wherein,
- the imaging device includes a pixel section including a transistor and a photoelectric conversion element,
- the transistor includes a first gate electrode, a first gate insulator, a semiconductor layer, a second gate insulator, and a second gate electrode in this order on a substrate,
- each of the first and second gate insulators includes one or a plurality of silicon compound films having oxygen, and
- a total sum of thicknesses of the one or the plurality of silicon compound films of both of the first and the second gate insulators is 10 nm or more and 65 nm or less.

18. The radiation imaging display system according to claim 17, wherein the first gate insulator is in direct contact with the semiconductor layer and the second gate insulator.

19. The radiation imaging display system according to claim 18, wherein each of the first gate electrode, the first gate insulator, the semiconductor layer, the second gate insulator, and the second gate electrode are successively layered in direct contact with each other on the substrate.

* * * * *